United States Patent [19]

Iwase

[11] Patent Number: 5,403,765
[45] Date of Patent: Apr. 4, 1995

[54] METHOD OF MANUFACTURING DOUBLE-LAYER GATE PROGRAMMABLE ROM

[75] Inventor: Taira Iwase, Kawasaki, Japan

[73] Assignee: Kabushiki Kaisha Toshiba, Kawasaki, Japan

[21] Appl. No.: 121,519

[22] Filed: Sep. 16, 1993

[30] Foreign Application Priority Data

Sep. 16, 1992 [JP] Japan ................. 4-246819

[51] Int. Cl.⁶ .......................................... H01L 21/265
[52] U.S. Cl. ........................................ 437/48; 437/49; 437/52; 437/45
[58] Field of Search ................. 437/52, 43, 45, 41, 437/48, 49, 52; 257/390–391, 314

[56] References Cited

U.S. PATENT DOCUMENTS

| | | | |
|---|---|---|---|
| 4,294,001 | 10/1981 | Kuo | 437/45 |
| 4,898,840 | 2/1990 | Okuyama | 437/41 |
| 5,081,052 | 1/1992 | Kobayashi et al. | 437/45 |
| 5,149,664 | 9/1992 | Shin et al. | 437/41 |
| 5,149,667 | 9/1992 | Choi | 437/52 |

*Primary Examiner*—Olik Chaudhuri
*Assistant Examiner*—H. Jey Tsai

*Attorney, Agent, or Firm*—Foley & Lardner

[57] ABSTRACT

A method of manufacturing a double-layer gate programmable ROM is disclosed including the steps of: forming a plurality of first gate layers at predetermined intervals on a semiconductor substrate, source and drain regions being formed on the surface of the semiconductor substrate and under the first gate layers, respectively; forming a plurality of second gate layers between the first gate layers, channel regions being formed on the surface of the semiconductor substrate and under the second gate layers, respectively; and selectively implanting ions into the channel regions to program data. In particular, the second gates are formed between the first gate layers so as to provide partial vertically overlapped portions at which one end of each of the second gate layers is overlapped partially with the other end of each of the first gate layers, respectively, and the ion implantation into the channel regions is effected under such a condition that ions can penetrate the first and second layers, but cannot penetrate the overlapped portions of both the first and second layers. Transistors are first formed having a first E-type threshold voltage. Selective ion implantation lowers the threshold voltage of certain of the transistors to program the data into the ROM.

9 Claims, 6 Drawing Sheets

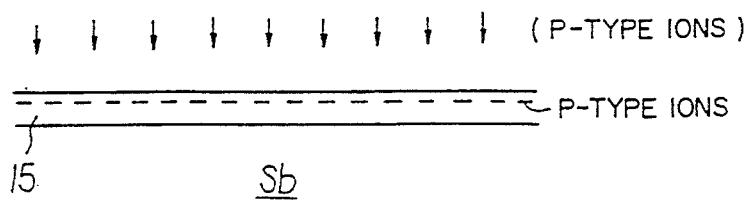
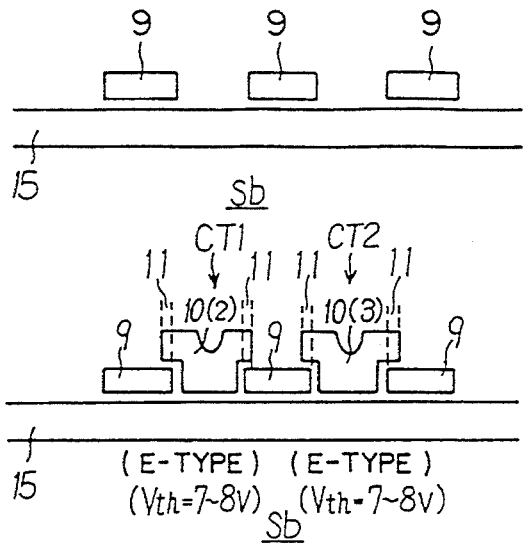
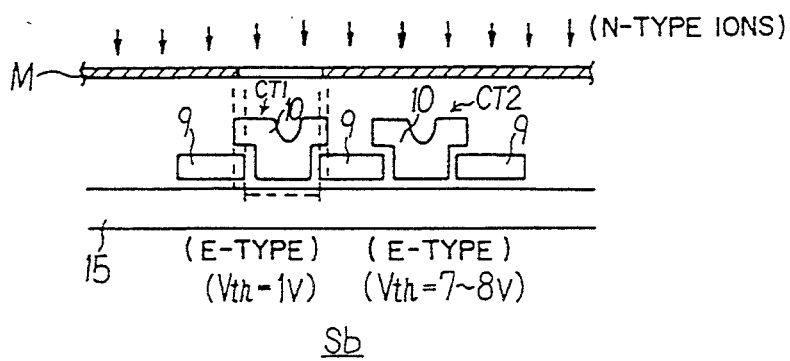
FIG. 4(a), FIG. 4(b), FIG. 4(c), FIG. 4(d)

METHOD OF MANUFACTURING DOUBLE-LAYER GATE PROGRAMMABLE ROM

FIELD OF THE INVENTION

The present invention relates to a method of manufacturing a double-layer gate programmable ROM, and more specifically to a method of manufacturing a double-layer gate programmable ROM to which data can be programmable by implanting ions to the channel regions.

BACKGROUND OF THE INVENTION

FIG. 5 is a circuit diagram showing a memory device manufactured in accordance with a first conventional method, in which a ROM composed of single-layer poly silicon NAND cells. Further, FIG. 6 is a plane view showing the actual memory device shown in FIG. 5, and FIG. 7 is a cross-sectional view taken along the line A-B in FIG. 6.

In FIG. 5, a bit line (aluminum wire) 1 is connected in series to two of series-connected transistors Tr1, Tr1; Tr2, Tr2; . . . A pair of the transistors Tr1 are select transistors; and a plurality of the transistors Tr2 are memory transistors. A pair of select lines (poly silicon layer) 2(1) and 2(2) are connected to the gates of a pair of the transistors Tr1, respectively. A plurality of word lines (poly silicon layer) 3(1), 3(2), . . . 3(n) are connected to the gates of the transistors Tr2, respectively.

As shown in FIGS. 6 and 7, the transistors Tr1 and Tr2 are constructed by forming poly silicon layers 2 and 3 (gates) on a semiconductor substrate Sb and between N+ layers 5 (source and drain layers) formed on the same semiconductor substrate Sb at regular intervals. Further, ion implantation regions 8 are formed by selectively implanting ions to some of the channel regions 8A under the poly silicon layers 2 and 3, respectively. Further, aluminum wires (bit lines) 1 are connected to contacts 7 to read data from the memory transistors Tr2, respectively.

The memory device as described above is manufactured in accordance with the first conventional method as follows: first, the gates of transistors Tr1 and Tr2 are formed on the surface portion of a semiconductor substrate Sb by forming poly silicon layers 2 and 3. Further, the sources and the drains thereof are formed by forming an N+ layer 5. Thereafter, data are written by selectively implanting ions into the channel regions 8A with the use of a mask (not shown) formed on the basis of data to be stored therein. In other words, the transistors operate in different way according to the presence or absence of ion implantation into the channel regions 8A, respectively. Therefore, data can be written in the respective transistors Tr1 and Tr2 by use of the programmed mask for ion implantation, and then the written data can be read.

FIG. 8 is a cross-sectional view showing the memory device manufactured in accordance with a second conventional method, in which a double-layer poly silicon NAND memory device is shown in particular. In the case of this structure, the ion implantation regions 8 are formed by selectively implanting ions into some of the channel regions 8A with the use of an ion implantation mask programmed on the basis of data to be first stored, so that the channel regions 8A can be selectively formed into depletion mode to store data. Thereafter, a first poly silicon layer 9 is formed on the semiconductor substrate Sb, and further a second poly silicon layer 10 is formed on the channel regions 8A to form gate electrodes. Then, the N+ layer 5 is formed.

In the double-layer poly silicon NAND masked ROM manufactured as shown in FIG. 8, there exists no N+ layer as the sources and the drains of the transistors from the structural standpoint, as well understood by the comparison between two first and second conventional methods as shown in FIGS. 7 and 8. Accordingly, the transistors can be arranged at a high density. Further, data can be read to the outside through the first poly silicon layers 9 when the second poly silicon layers 10 are activated as the gate electrodes.

In the above-mentioned two memory devices manufactured in accordance with two different conventional methods as shown in FIGS. 7 and 8, there exist different problems as follows: In the case of the single-layer poly silicon NAND masked ROM manufactured in accordance with the first conventional method as shown in FIGS. 5 to 7, it is difficult to arrange the transistors at a high density. In contrast with this, in the case of the double-layer poly silicon NAND ROM manufactured in accordance with the second conventional method as shown in FIG. 8, it is possible to arrange the transistors at a high density. On the other hand, however, since the ion implantation regions 8 must be determined to be broader than the channel regions 8A under due consideration of mask offset, there raises another problem in that ions are implanted into the adjacent channel regions, thus causing a deterioration of production yield. Further, it may be possible to prevent ions from being implanted into the adjacent regions by forming long channels. In this countermeasures, however, the transistors cannot be arranged at high density.

Further, in the case of the single-layer poly silicon NAND masked ROM as shown in FIGS. 5 to 7, in order to shorten the turn-around time, in general there has been adopted such a method of implanting ions into the channel regions from above after the gates 2 and 3 have been formed. In contrast with this, in the case of the double-layer poly silicon NAND masked ROM, ions are not easily implanted through the overlapped portions of the first poly silicon layer 9 and the second poly silicon layer 10 under the ordinary ion implantation conditions. Therefore, these overlapped portions are left in enhancement mode ever after the ion implantation, with the result that the device cannot be operated as the NAND masked ROM. To overcome this problem, conventionally, ions are implanted before forming the gates of the first poly silicon layer 9, at the sacrifice of the reduction of the turn-around time.

SUMMARY OF THE INVENTION

With these problems in mind, therefore, the object of the present invention provide a method of manufacturing a double-layer poly silicon masked ROM, by which the mask offset can be prevented without sacrifice of the reduction of the turn-around time.

To achieve the above-mentioned object, the present invention provides a method of manufacturing a double-layer gate programmable ROM by the steps of: forming a plurality of first gate layers at predetermined intervals on a semiconductor substrate, source and drain regions being formed on the surface of the semiconductor substrate and under the first gate layers, respectively; forming a plurality of second gate layers between the first gate layers, channel regions being formed on the surface of the semiconductor substrateand under the second gate layers, respectively; and selectively implanting ions into the channel regions for data program, wherein the second gates are formed between the first gate layers so as to provide partial vertically overlapped portions at which one end of each of the second gate layers is overlapped partially with the other end of each of the first gate layers, respectively; and the ion implantation into the channel regions is effected under such a condition that ions can penetrate the first and second layers, respectively but cannot penetrate the overlapped portions of both the first and second layers.

In the method of manufacturing the double-layer gate programmable ROM according to the present invention, data can be programmed by implanting ions into the channel portions. In this process, ions will not penetrate through the overlapped portions between the first gate layer and the second gate layer. Therefore, the ion implantation ranges can be self-aligned at the channels to be ion-implanted. Further, since the ion implantation is effected after the first and second gate layers have been both formed, it is possible to realize the reduction of the turn-around time.

BRIEF DESCRIPTION OF THE DRAWINGS

FIGS. 4(a) to (d) are cross-sectional views for assistance in explaining the process of forming the memory device, taken along the lines C-D shown in FIG. 3;

DETAILED DESCRIPTION OF THE PREFERRED EMBODIMENTS

The embodiments of the method of manufacturing the double-layer gate programmable ROM according to the present invention will be described hereinbelow with reference to the attached drawings.

FIGS. 1(a) to (d) are cross-sectional views for assistance in explaining the process of manufacturing a double-layer gate programmable ROM in accordance to the method of the present invention.

Figure 1A:
FIGS. 1(a) to (d) are cross-sectional views for assistance in explaining the process of forming a memory device in accordance with a first embodiment of the method according to the present invention.

First, as shown in FIG. 1(a), N conductive type ions are implanted into the whole surface of a semiconductor substrate Sb.

Figure 1B:
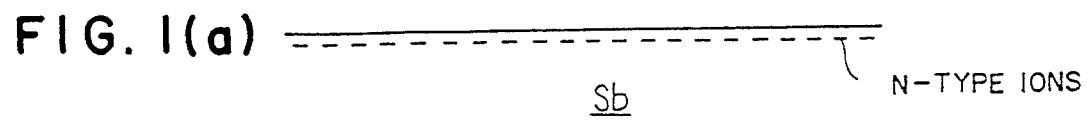

Further, as shown in FIG. 1(b), a plurality of first poly silicon layers 9 are formed on the semiconductor substrate Sb.

Figure 1C:
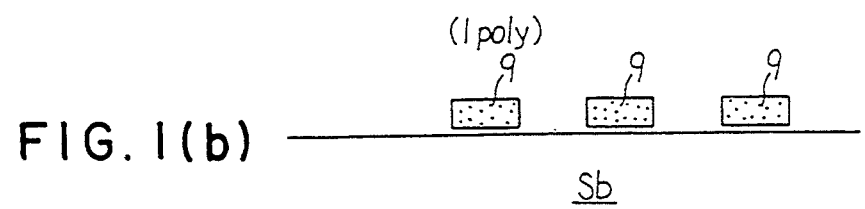

Next, as shown in FIG. 1(c), a plurality of second poly silicon layers 10 are formed as the gates. Under these conditions, all the cell transistors $CT_1$ and $CT_2$ are of depletion type. Further, an N+ layer 5 is formed in the vicinity of the surface of the substrate Sb.

Figure 1D:
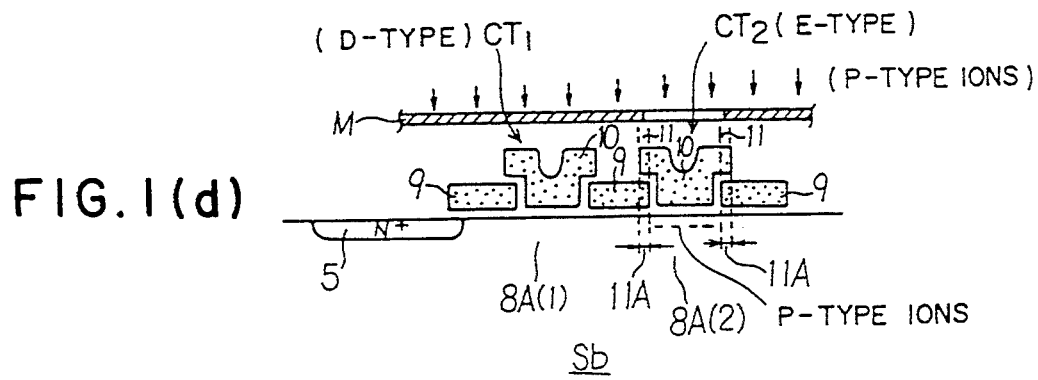

Further, as shown in FIG. 1(d), P-type ions are implanted from above the first and second poly silicon layers 9 and 10 by use of a mask formed in accordance with a data program. The mask M shown in FIG. 1(d) is formed with openings over the cell transistor $CT_2$ but no opening over the cell transistor $CT_1$. Therefore, the P-type ions can be implanted into the channel region 8A(2) under the cell transistor $CT_2$, but the P-type ions cannot be implanted into the channel region 8A(1) under the cell transistor $CT_1$. In the cell transistor $CT_2$ to which ions are implanted, since N-type ions already implanted are canceled by the P-type ions, the transistor changes to enhancement mode. In this case, the threshold value of the transistor $CT_2$ is set to about 1V. Further, the acceleration voltage for ion implantation is determined to such an extent that ions can be passed through only the first or second poly silicon layer 9 or 10 (non-overlapped portions) but will not be passed through overlapped portions 11 of the first and second poly silicon layers 9 and 10. As a result, the portions 11A under the overlapped portions 11 are kept as the transistor of the depletion type, so that the transistor can operate normally. Further, in the above-mentioned ion implantation into the channel regions with the use of the mask, since the presence of the overlapped portion 11 realizes a self-alignment, the masked ROM can be formed at a high density.

Figure 2:
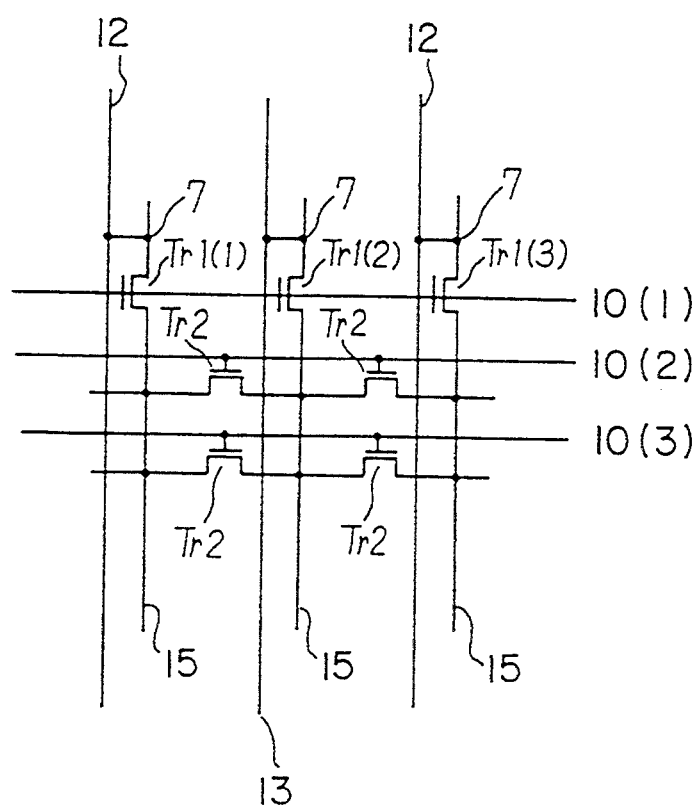
FIG. 2 is a circuit diagram showing a memory device manufactured in accordance with another embodiment of the method according to the present invention.

FIG. 2 is a circuit diagram showing a semiconductor memory device manufactured in accordance with another embodiment of the present invention.

As shown in FIG. 2, a select line (poly silicon layer) 2 is connected to the gates of transistors Tr1(1), Tr1(2) and Tr1(3), and word lines (poly silicon layer) 3(1) and 3(2) are connected to the gates of transistors Tr2, respectively. Further, main bit lines (aluminum wire) 12 are connected to the two select transistors Tr1(1) and Tr1(3) arranged on both right and left sides in FIG. 2, respectively; and a virtual ground line (aluminum wire) 13 is connected to the middle select transistor Tr1(2).

Figure 3:
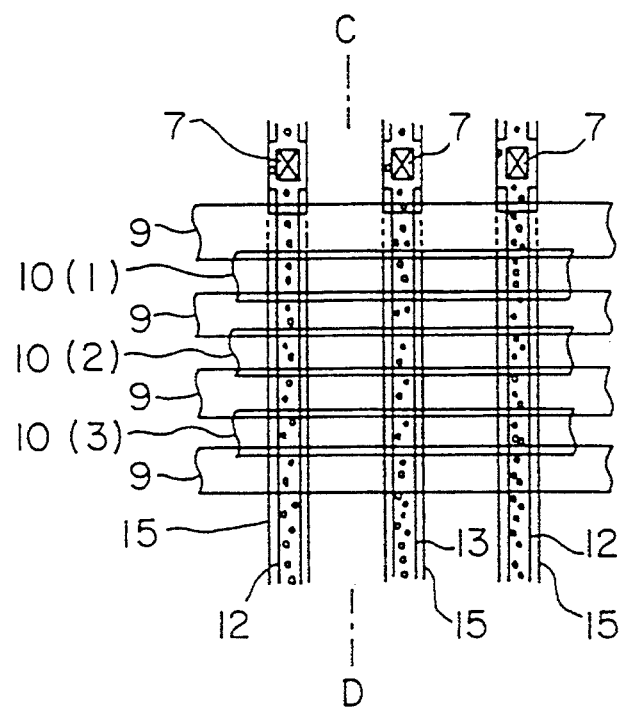
FIG. 3 is a plane view showing an actual example of the memory device shown in FIG. 2.
Figure 5:
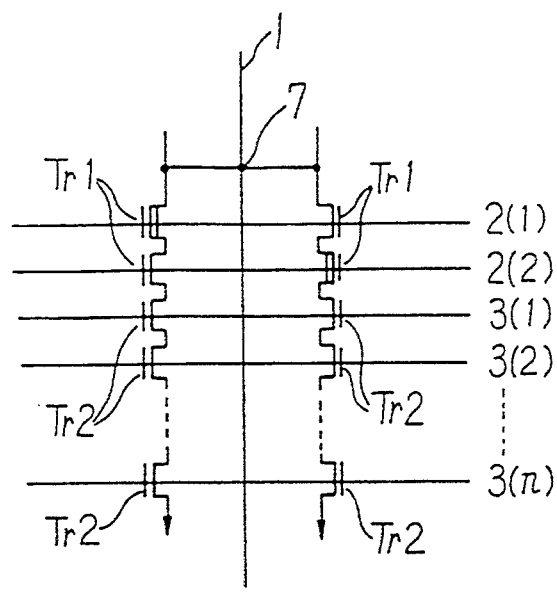
FIG. 5 is a circuit diagram showing a memory device manufactured in accordance with a first conventional method.
Figure 6:
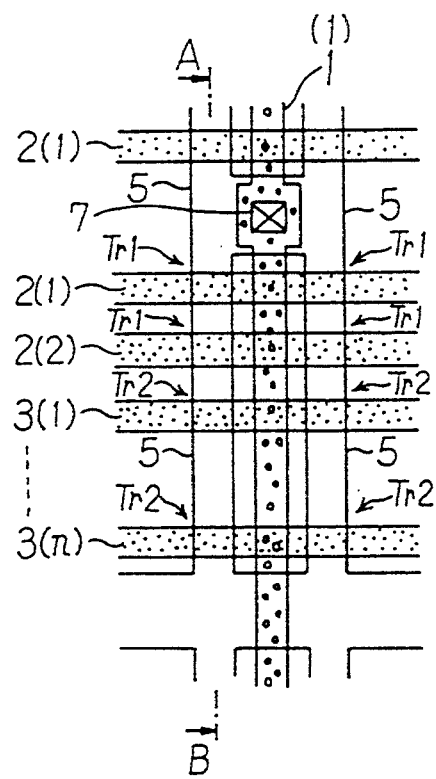
FIG. 6 is a plane view showing the memory device shown in FIG. 5.
Figure 7:
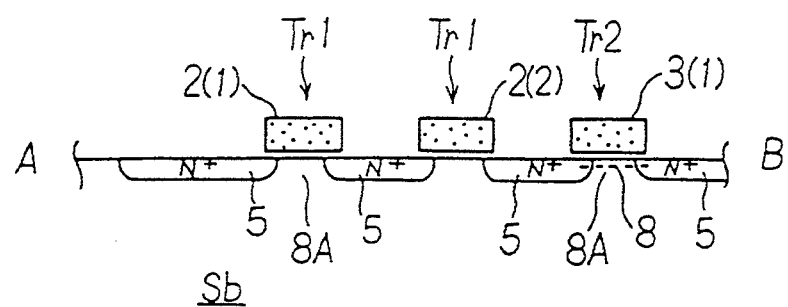
FIG. 7 is a cross-sectional view of the memory device, taken along the line A-B shown in FIG. 6.
Figure 8:
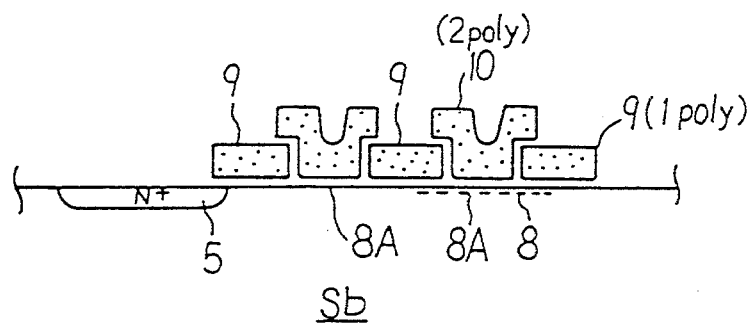
FIG. 8 is a cross-sectional view of the memory device manufactured in accordance with a second conventional method.

FIG. 3 is a practical plane view showing the memory device shown in FIG. 2, in which the source regions and the drain regions are formed by an N+ buried layer 15. In FIG. 3, an NOR type cell can be formed by arranging first poly silicon layers 9 and second poly silicon layers 10 alternately perpendicular to the buried layer 15.

FIGS. 4(a) to (d) are cross-sectional views for assistance in explaining the process of manufacturing the memory device, taken along the line C-D in FIG. 3.

As shown in FIG. 4(a), the N+ buried layer 15 is formed on the semiconductor substrate Sb to arrange the source and drain regions. Further, P-type ions are implanted all over the surface of the substrate Sb.

Further, as shown in FIG. 4(b), the first poly silicon layers 9, 9, . . . are formed on the semiconductor substrate Sb.

Thereafter, as shown in FIG. 4(c), the gates are formed by the second poly silicon layer 10s (10(2), 10(3)). The second poly silicon layers 10 are formed in such a way as to provide overlapped portions 11 between the first poly silicon layer 9 and the second poly silicon layer 10. Under these conditions, the cell transistors CTr1 and CTr2 are all of enhancement type. The threshold voltage of these transistors CTr1 and CTr2 is about 7 to 8 volts, so that the cell transistors are kept turned off under the ordinary operating conditions.

Thereafter, as shown in FIG. 4(d), N type ions are implanted into the substrate Sb with the use of a mask M formed in accordance with a data program. In this case, since P type ions already implanted are canceled by the N type ions in only the transistors $CT_1$, the transistor $CT_1$ changes to the ordinary enhancement type of about 1V threshold value. The acceleration voltage of the ion implantation is to such an extent that the ions are passed through the single poly silicon layer but not passed through the overlapped portions 11 at which the two poly silicon layers 9 and 10 are overlapped with each other, in the same way as with the case of the first embodiment. Accordingly, the transistor formed under the overlapped portion 11 is kept as the transistor of enhancement type of about 7 to 8V threshold value. In other words, the transistor $CT_1$ to which ions are implanted is of ordinary enhancement type transistor of about 1V threshold value. On the other hand, the region under the overlapped portion is kept as the transistor of about 7 to 8V threshold value, so that the transistor is kept turned off under the normal conditions, while enabling the normal operation. Further, with respect to the mask alignment in the above-mentioned ion implantation into the channel regions, since the presence of the overlapped portion 11 realizes a self-alignment manner, the masked ROM can be formed at a high density.

As described above, in the method of manufacturing the double-layer programmable ROM according to the present invention, since the ion implantation regions can be limited to narrow ranges accurately in accordance with the self-alignment method, it is possible to manufacture a fine and high-density masked ROM. In addition, since the ions can be implanted with the use of a mask formed on the basis of data program, after the double-layers have been formed, it is possible to shorten the turnaround time, thus improving the productivity of the memory device.

What is claimed is:

1. The method of manufacturing a double-layer gate programmable ROM comprising the steps of:
    forming a plurality of first gate layers at intervals on a semiconductor substrate, a source and/or drain region being formed on the surface of the semiconductor substrate under each of the first gate layers, respectively;
    forming a plurality of second gate layers between the first gate layers, channel regions being formed on the surface of the semiconductor substrate under each of the second gate layers, respectively; and
    selectively implanting ions into the channel regions to program data in said ROM,
    wherein the second gate layers are formed between the first gate layers so as to provide partial vertically overlapped portions at which one end of each of the second gate layers is overlapped partially with the other end of each of the first gate layers, respectively and the step of selectively implanting ions into the channel regions is carried out under such a condition that the ions can penetrate the first and second layers, respectively, but cannot penetrate the overlapped portions of the first and second layers, and
    wherein an N+-type buried layer is formed on the surface of the semiconductor substrate, P-type ions are implanted on the surface of the N+-type buried layer, and thereafter, the first and second gate layers are formed to form enhancement-type transistors, and thereafter, N-type ions are implanted selectively into selected ones of the enhancement-type transistors to decrease the threshold voltage of only the selected transistors.

2. The method of manufacturing a double-layer gate programmable ROM as recited claim 1, wherein the selected transistors are enhancement-type transistors having a threshold voltage of about 1V and the threshold voltage of the non-selected enhancement-type transistors is about 7 to 8V.

3. A method of manufacturing a double-layer gate programmable ROM having NOR type transistors comprising the steps of:
    forming a first conductive type layer on a surface of a semiconductor substrate;
    implanting second conductive type ions on a surface of said first conductive type layer such that a threshold value of transistors being formed on the substrate is a first enhancement-type (E-type) threshold value;
    forming a plurality of first gates at intervals over the semiconductor substrate, a source and/or drain of the transistors being formed being under each of the first gates and on the surface of the substrate;
    forming a plurality of second gates, each between two adjacent first gates such that an overlap portion is formed by a partial vertical overlap of end portions of each of the second gates with an end portion of each of the two adjacent first gates, a channel of the transistors being formed being under each of the second gates and on the surface of the substrate; and
    selectively implanting second conductive type ions onto selected channels under the second gates through a mask, under such conditions that ions can pass through the first and second gates respectively, but cannot pass through the overlap portions at which the end portions of the second gate overlaps the end portions of the two adjacent first gates respectively, such that a second threshold value of a transistor having a channel selectively implanted with the second conductive type ions is lower than the first E-type threshold value.

4. The method recited in claim 3, wherein the second gates are each formed with the overlapped portions on both ends thereof along a longitudinal direction of the channel.

5. The method recited in claim 3, wherein the mask used for the selective ion implantation is formed with ion-passing openings over the selected channels.

6. The method recited in claim 5, wherein a length along the channel longitudinal direction of each of the ion-passing openings formed in the mask extends from a midway point of an overlap portion of one of said two adjacent first gates to a midway point of an overlap portion of the other of said two adjacent first gates.

7. The method recited in claim 3, wherein an N+-type buried layer is formed on the surface of the semiconductor substrate, P-type ions are implanted on the surface of the N+-type buried layer, thereafter, the first and second gates are formed to from the E-type transistors, and N-type ions are selectively implanted into the E-type transistors to decrease the second threshold voltage of only the selectively ion-implanted transistors.

8. The method recited in claim 7, wherein the second threshold voltage of the selectively ion-implanted transistors is about 1V and the first E-type threshold voltage of non ion-implanted transistors is about 7 to 8V.

9. The method recited in claim 3, wherein one of the source and drain of at least one transistor is connected to a high supply voltage, and the other of the source and drain is connected to a low supply voltage.

* * * * *